United States Patent [19]

Shinkawa et al.

[11] 4,219,779
[45] Aug. 26, 1980

[54] SELF-OSCILLATING MIXER CIRCUIT

[75] Inventors: Keiro Shinkawa, Yokohama; Hiroji Shoyama, Fukuoka; Chuichi Sodeyama, Yokohama; Mitsuhisa Shinagawa, Fujisawa, all of Japan

[73] Assignee: Hitachi, Ltd., Japan

[21] Appl. No.: 897,118

[22] Filed: Apr. 17, 1978

[30] Foreign Application Priority Data

Apr. 18, 1977 [JP] Japan ................................ 52-43575

[51] Int. Cl.$^2$ .............................................. H04B 1/26
[52] U.S. Cl. ................... 455/321; 455/325; 455/333
[58] Field of Search ............... 325/436, 437, 442, 440, 325/441, 445, 446, 449, 451, 443; 363/163

[56] References Cited

U.S. PATENT DOCUMENTS

| | | | |
|---|---|---|---|
| 3,127,562 | 3/1962 | Harvey et al. | 325/451 |
| 3,207,990 | 9/1965 | Nestlerode | 325/440 |
| 3,348,155 | 10/1967 | Von Recklinghausen | 325/440 |
| 3,510,781 | 5/1970 | Wollesen | 325/451 |
| 4,031,472 | 6/1977 | Shinkawa et al. | 325/446 |
| 4,056,787 | 11/1977 | Saitoh et al. | 325/440 |

OTHER PUBLICATIONS

"FET Mixers Offer Gain", Microwave News, Apr. 1975, p. 12.
International Microwave Symposium Digest 1977, IEEE MTT-S, pp. 270-272.
"GaAs FET Osc. Which is Stabilized with a Dielectric Resonator", Lecture Paper at 1976-Year all-Japan Conference of Institute of Electronics and Communications Engineers of Japan.

*Primary Examiner*—John C. Martin
*Assistant Examiner*—Jin F. Ng
*Attorney, Agent, or Firm*—Craig and Antonelli

[57] ABSTRACT

A self-oscillating mixer circuit to operate mainly at SHF band comprises a single-gate FET and a micro strip line. The gate or source terminal of the FET is connected to a radio frequency signal input line. A feedback path is provided between the drain terminal and the gate or source terminal. An intermediate frequency output line is connected to the drain electrode of the FET. A dielectric resonator is coupled to the radio frequency signal input line to improve the stability of an oscillator frequency and to suppress leakage of a local oscillator signal.

6 Claims, 5 Drawing Figures

SELF-OSCILLATING MIXER CIRCUIT

LIST OF PRIOR ART REFERENCES (37 CFR 1.56(a))

The following references are cited to show the state of the art:
1. "MICROWAVES" News, April, 1975, p. 12 with a title of "FET mixers offer gain"
2. International Microwave Symposium Digest 1977, IEEE MTT-S, pp. 270–272
3. Paper of Lecture at 1976-year all-Japan conference of the Institute of Electronics and communication Engineers of Japan, p. 108 with a title of "GaAs FET oscillator which is stabilized with a dielectric resonator"

BACKGROUND OF THE INVENTION

The present invention relates to a selfoscillating mixer circuit using a single-gate field effect transistor (FET). In particular, the invention relates to a mixer circuit which is best suited for frequency conversion of a signal of a superhigh frequency of SHF-band.

There has been hitherto known an oscillator circuit to operate at SHF-band which comprises as a fundamental component a so-called micro strip line constituted by conductors of various configurations disposed in a planar manner on an insulation substrate having a rear surface covered wholly with an electrical conductive material and a FET, as is shown in FIG. 1. As can be seen from this figure, the FET 1 has a source terminal 2 grounded and a gate terminal 3 thereof connected to a drain terminal 4 through lines 5a and 5b which constitutes a feedback path. Reference character 5c represents a DC component blocking capacitor. Thus, the lines 5a and 5b may be considered to be directly connected to each other for AC signal components. The signal appearing at the drain terminal 4 is fed back to the gate terminal 3 through the lines 5a and 5c. The phase of the signal fed back to the gate terminal 3 will vary in dependence on the frequency thereof. Since a positive feedback takes place for a signal of a predetermined frequency, oscillation will occur at such a predetermined frequency. Thus, by selecting the length of the lines 5a and 5b so that the positive feedback may be provided at a desired frequency, at which the oscillation is to occur, the oscillator circuit of the desired frequency can be obtained. In FIG. 1, means for applying a DC bias voltage to an FET is not shown. Since such DC bias voltage applying means is irrelevant to the essence of the invention, the description as well as illustration thereof will be omitted herein.

In view of the fact that the signals of the same phase on a line of a certain length do not always have a single frequency but may have an integral multiple of that frequency, there may arise such a situation in which the oscillator frequency differs from the desired frequency. However, since the frequency at which the oscillation may readily take place is determined by the characteristic of an FET as actually used, it is a simple matter in practice to have the oscillator circuit of a desired frequency by correspondingly selecting the type of an FET to be used. In order to more positively assure the oscillation only at the desired frequency, the feedback lines 5a and 5b may be realized in a form of a low-pass filter to block harmonic components.

The circuit shown in FIG. 1 is constructed as a self-oscillating mixer circuit by providing an input line for radio frequency signals connected to the gate terminal 3 and an output line 7a connected to the drain terminal 4 and incorporating therein a low-pass filter 7 adapted to pass therethrough an intermediate frquency signal. With such circuit arrangement, it is possible to derive the intermediate frequency (IF) signal from the low-pass filter which has a frequency corresponding to the difference between the frequency of the radio frequency signal input from the line 6 and the oscillator frequency. When an IF signal is selected to have a frequency of UHF-band or VHF-band, the low-pass filter 7 can be easily implemented by the micro strip line. Since the IF signal is output with a gain relative to the amplitude of the input radio frequency signal, there can be an advantage such that the implementation of circuits succeeding to the low-pass filter 7 is accomplished in a facilitated manner as compared with a diode mixer or the like, and the oscillation, frequency conversion as well as amplification can be attained simultaneously in a simplified circuit configuration.

The self-oscillating mixer circuit may be also implemented by exchanging the connections to the source 2 and the gate 3 of FET 1.

It is also known to connect a bypass circuit 9 for bypassing intermediate frequency signals to the input line 6 for the radio frequency signal, as is shown in FIG. 2. This bypass circuit 9 may be constituted by a quarter-wavelength ($\frac{1}{4}-\lambda$) line 9a so as to be opened for a radio frequency signal and a capacitor 9b for coupling the end of the $\frac{1}{4}-\lambda$ line 9a to the ground in respect of AC signals. The capacitor 9b functions to prevent a DC voltage for the gate bias from being grounded and a capacitance of the capacitor 9b is so selected as to provide a sufficiently low impedance at the intermediate frequency. Since the intermediate frequency is set to be sufficiently low as compared with the radio frequency signals, the length of the line 9a and a portion of the line 6 extending from the gate terminal 3 to the capacitor 9b may be left out of consideration for the intermediate frequency signals. The gate terminal 3 may be regarded as being grounded. Thus, the intermediate frequency signals can be outputted from the drain terminal 4 with a high efficiency.

The self-oscillating mixer circuit of the arrangement described above has however a serious drawback that a remarkable leakage of the local oscillation signal into the radio frequency signal input circuit will occur through the radio frequency signal input line 6. With an attempt to evade such difficulty, it is contemplated to connect to the input line a trap circuit 8 for the local oscillation signal constituted by an open-ended line of a length corresponding to a quarter-wavelength of the oscillator-frequency signal, as is shown in FIG. 3. However, such a trap circuit 8 has a low Q and involves a loss to the radio frequency signal as well as damping of the input signal applied to the gate terminal 3, which is further aggravated by the fact that the local oscillator frequency is very close to that of the radio frequency signal. Further, since the oscillator frequency is determined by the phase shift of the signal due to the length of the lines 5a and 5b as described hereinbefore, the low Q of this feedback path exerts an adverse influence to the stability of the oscillator frequency.

SUMMARY OF THE INVENTION

Accordingly, an object of the invention is to provide a self-oscillating mixer circuit of SHF-band which is insusceptible to leakage of an oscillator output to a radio frequency signal input and a loss of the radio frequency signal and exhibits an improved stability of the oscillator frequency.

In view of the above object, there is proposed according to a feature of the invention a self-oscillating mixer circuit which comprises an FET of common source connection or common gate connection, means connected to a drain terminal serving as the output terminal of an FET for gating thereto an intermediate frequency signal, feedback means for feeding back the output signal from an output terminal of the FET to a control terminal, i.e. from a drain to the gate (in the case of the common source connection) or to a source (in the case of the common gate connection) thereby to bring about oscillation, a line for supplying a radio frequency signal to the gate or source of an FET, and a dielectric resonator having a high Q and connected to the line. By selecting appropriately the position or distance of the dielectric resonator from the gate or source, the oscillator frequency can be stabilized and the leakage of the local oscillator output can be reduced without loss of the radio frequency signal.

DETAILED DESCRIPTION OF THE PREFERRED EMBODIMENTS

Figure 1:
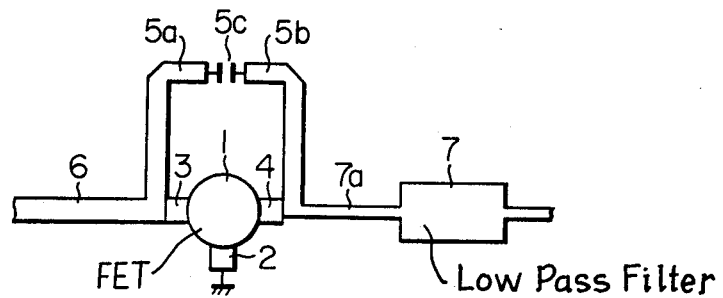
FIG. 1 is a schematic pattern diagram showing a main portion of a known self-oscillating mixer circuit which comprises a known FET oscillator circuit constituted by micro strip line and provided with a radio frequency signal input means and an intermediate frequency signal output means.
Figure 2:
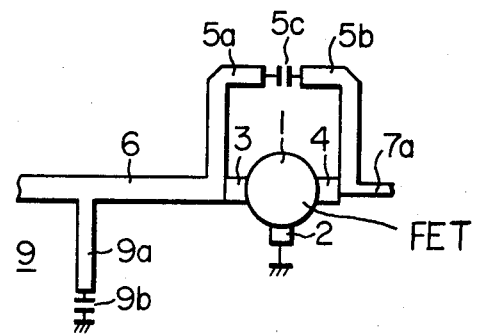
FIG. 2 is a schematic pattern diagram showing a main portion of another known self-oscillating mixer circuit which includes a bypass circuit for bypassing an intermediate frequency signal added to the circuit shown in FIG. 1.
Figure 3:
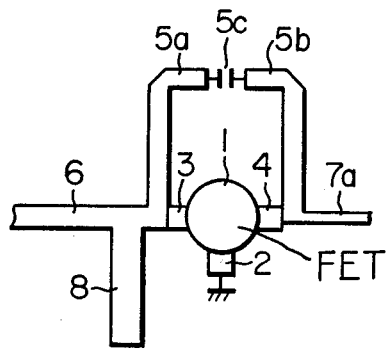
FIG. 3 is a schematic pattern diagram showing a main portion of another example of hitherto known self-oscillating mixer circuit incorporating a trap circuit for the local oscillator signal constituted by a micro strip line and provided at the input line of the mixer circuit shown in FIG. 1.
Figure 4:
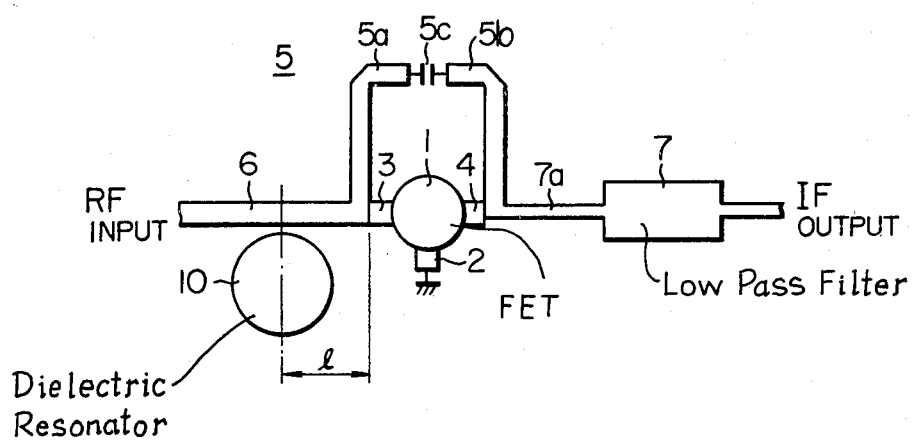
FIG. 4 is a schematic pattern diagram showing a main portion of a self-oscillating mixer circuit incorporating a dielectric resonator according to an embodiment of the invention.

Referring to FIG. 4 which shows in a schematic plan view a self-oscillating mixer circuit according to an embodiment of the invention, a field effect transistor or FET 1 is provided in a common source connection with a feedback path 5 being provided between a drain terminal 4 and a gate terminal 3. The feedback path 5 is constituted by lines 5a to 5b and a DC component blocking capacitor 5c. A low-pass filter 7 for an intermediate frequency signal is connected to the drain terminal 4 through an output line 7a. A dielectric resonator 10 is provided at a location in the vicinity of a radio frequency signal input line 6. The dielectric resonator 10 is formed by a solid or cubic body (e.g. a cube, cylinder, disc or the like) having a large dielectric constant and has a resonant frequency determined by the geometrical factors such as shape, dimension or the like as is in the case of a cavity resonator. A dielectric resonator formed of a material of $TiO_2$-series and having a dielectric constant of about 30 and a no-loaded Q of about 5000 at a frequency of SHF-band is practically available. The dielectric resonator 10 can be effectively operatively coupled to the input line 6 merely by disposing the former adjacent to the latter and constitutes a trap circuit of a very narrow bandwidth due the high Q thereof. The trap circuit constituted by the dielectric resonator 10 is equivalent to a trap circuit having a series LC-resonance circuitry grounding the input line 6 and exhibits an extremely higher Q than a lumped parameter line of LC elements. When the resonator frequency of the dielectric resonator 10 is selected to be equal to a desired local oscillator frequency, the input line 6 is then provided with a trap circuit which is capable of suppressing steeply only the local oscillator frequency while exerting no influence to the radio frequency signal.

Further, since the input line 6 is grounded at the resonant frequency or frequencies very close to the resonant frequency, the impedence of the line 6 at the resonant frequency as viewed from the gate 3 can be freely selected by correspondingly selecting the line length 1 between the point at which the dielectric resonator 10 is coupled to the line 6 and the gate terminal 3. At the frequencies other than the resonant frequency, the impedance of the line 6 as viewed from the gate 3 can be made equal to the characteristic impedance of the line 6 by connecting an impedance element (not shown) having an impedance equal to the characteristic impedance to the input terminal. Thus, only the signal of the frequency equal to the resonant frequency can undergo a large phase shift, whereby the oscillation condition of the feedback path 5 can be established in a very narrow frequency range. Consequently, the oscillator frequency is determined by the resonant frequency of the dielectric resonator 10 having a high Q, which results in a highly improved stability of frequency.

A similar effect can be attained also in the gate-grounded circuit configuration in which the connections of the source terminal 2 and the gate terminal 3 of an FET 1 in the embodiment shown in FIG. 4 are exchanged with each other.

Figure 5:
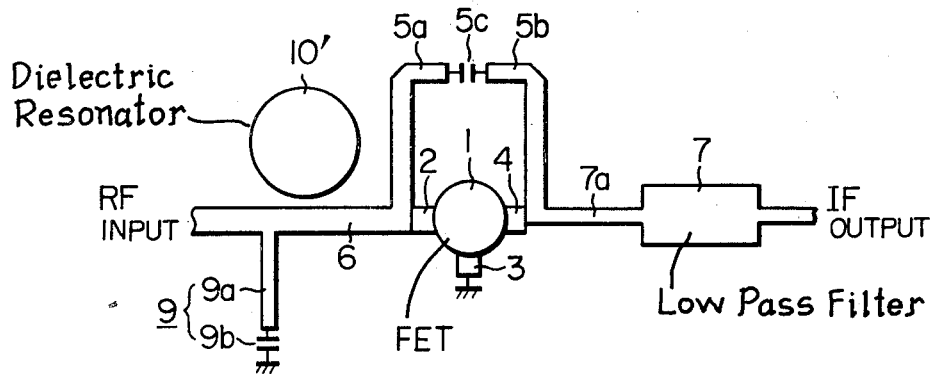
FIG. 5 shows schematically a main portion of the self-oscillating mixer circuit according to another embodiment of the invention.

Referring to FIG. 5 which is a plan view showing another exemplary embodiment of the invention, a dielectric resonator 10' is coupled to the radio frequency signal input line 6 of a self-oscillating mixer circuit such as shown in FIG. 4 but additionally including a bypass circuit 9 for bypassing an intermediate frequency signal connected to the input line 6. The FET 1 is provided in the gate-grounded configuration with the input line 6 being connected to the source terminal 2. It should however be noted that the sourcegrounded connection such as shown in FIG. 4 may be alternatively adopted in the circuit shown in FIG. 5. The dielectric resonator 10' has the same function as the dielectric resonator 10 described above in conjunction with FIG. 4. An improved stability of the oscillator frequency as well as an effective suppression of leakage of the local oscillator signal can be attained without loss for the radio frequency input signal. Further, due to the provision of the bypass circuit 9 for bypassing the intermediate frequency signal, the intermediate frequency signal output can be derived with a high efficiency.

We claim:

1. A self-oscillating mixer circuit adapted for converting a radio frequency signal of SHF-band into an intermediate frequency signal, comprising:
   a field effect transistor having a control terminal, a common terminal and an output terminal;
   a feedback path connected between the control terminal and the output terminal of said field effect transistor and adapted to provide a positive feedback of a signal having a desired oscillator frequency to said control terminal from said output terminal;
   a micro strip line connected to the control terminal of said field effect transistor and adapted to feed said radio frequency signal thereto;
   a dielectric resonator of a solid body formed of a dielectric material and having a resonant frequency coincident with said desired oscillator frequency, said dielectric resonator being coupled to said radio frequency feeding line; and
   a low-pass filter constituted by a micro strip line connected to the output terminal of said field effect transistor and passing therethrough the intermediate frequency signal.

2. A self-oscillating mixer circuit adapted for converting a radio frequency signal of SHF band into an intermediate frequency signal, comprising:
   a field effect transistor having a control terminal, a common terminal and an output terminal;
   a feedback path connected between the control terminal and the output terminal of said field effect transistor and adapted to provide a positive feedback of a signal having a desired oscillator frequency to said control terminal from said output terminal;
   a micro strip line connected to the control terminal of said field effect transistor and adapted to feed a radio frequency signal thereto;
   a dielectric resonator of a solid body formed of a dielectric material and having a resonant frequency coincident with said desired oscillator frequency, said dielectric resonator being coupled to said radio frequency signal feeding line;
   a bypass circuit connected to said radio frequency signal feeding line and adapted to bypass the intermediate frequency signal while providing a high impedance to the radio frequency signal; and
   a low-pass filter constituted by a micro strip line connected to the output terminal of said field effect transistor and passing therethrough the intermediate frequency signal.

3. A self-oscillating mixer circuit as set forth in claim 1 or 2, wherein said field effect transistor has a gate serving as said control terminal, a drain serving as said output terminal and a source grounded to serve as said common terminal.

4. A self-oscillating mixer circuit as set forth in claim 1 or 2, wherein said field effect transistor has a source serving as said control terminal, a drain serving as said output terminal and a gate grounded to serve as said common terminal.

5. A self-oscillating mixer circuit as set forth in claim 2, wherein said bypass circuit for bypassing the intermediate frequency signal is constituted by a micro strip line having DC component blocking means.

6. A self-oscillating mixer circuit as set forth in claim 1 or 2, wherein said feedback path is constituted by a micro strip line having DC component blocking means.

* * * * *